(12) United States Patent
Ueda et al.

(10) Patent No.: US 7,772,501 B2
(45) Date of Patent: Aug. 10, 2010

(54) FLEXIBLE PRINTED CIRCUIT BOARD

(75) Inventors: Susumu Ueda, Kagoshima (JP); Shuichi Arimura, Kagoshima (JP)

(73) Assignees: Molex Incorporated, Lisle, IL (US); Innovation TS Flex-Technology (MY)

( * ) Notice: Subject to any disclaimer, the term of this patent is extended or adjusted under 35 U.S.C. 154(b) by 923 days.

(21) Appl. No.: 11/448,717

(22) Filed: Jun. 8, 2006

(65) Prior Publication Data

US 2007/0246248 A1    Oct. 25, 2007

(30) Foreign Application Priority Data

Apr. 25, 2006    (JP)    .............................. 2006-120587

(51) Int. Cl.
*H05K 1/03*    (2006.01)
(52) U.S. Cl. ........................ 174/254; 174/260; 361/749
(58) Field of Classification Search ................. 174/254, 174/260; 361/749–751
See application file for complete search history.

(56) References Cited

U.S. PATENT DOCUMENTS

| | | | | |
|---|---|---|---|---|
| 5,062,203 | A | * 11/1991 | Miller et al. ................... | 29/852 |
| 5,616,888 | A | * 4/1997 | McLaughlin et al. ........ | 174/260 |
| 6,344,308 | B1 | 2/2002 | Kurita et al. | |
| 6,885,090 | B2 * | 4/2005 | Franzon et al. ............. | 257/678 |
| 7,473,579 | B2 * | 1/2009 | Sharifi et al. ................ | 438/107 |

FOREIGN PATENT DOCUMENTS

| | | |
|---|---|---|
| JP | 61-114872 | 7/1986 |
| JP | S63-005636 | 1/1988 |
| JP | H01-140871 | 9/1989 |
| JP | H04-228553 | 8/1992 |
| JP | 04-356996 | 12/1992 |
| JP | 07-029871 | 6/1995 |
| JP | H10-341081 | 12/1998 |
| JP | 11-195850 | 7/1999 |
| JP | 2003-124580 | 4/2003 |
| WO | PCT/US01/07460 | 11/2001 |

* cited by examiner

*Primary Examiner*—Jeremy C Norris
(74) *Attorney, Agent, or Firm*—Timothy M. Morella

(57) ABSTRACT

A flexible printed circuit board (FPC) is disclosed which can eliminate the need for forming through holes and ensure the strength required for mounting components. The FPC has a metal foil layer formed only on one side of an insulating layer via an adhesive layer. The FPC is configured such that the insulating layer and the adhesive layer are partially removed, and the surface of the metal foil layer on the side from which the insulating layer and the adhesive layer have been removed is flattened. In a region from which the insulating layer and the adhesive layer have been removed, an overcoat layer for reinforcing the metal foil layer is provided along the metal foil layer on a surface opposite to the flattened surface. A drive IC is mounted on a first metal foil face of the metal foil layer and on a second metal foil face which is the flattened surface of the metal foil layer, and is provided with electrical conduction by the metal foil layer. To form the FPC, the insulating layer and the metal foil layer can be directly affixed to each other without using the adhesive layer.

4 Claims, 1 Drawing Sheet

FLEXIBLE PRINTED CIRCUIT BOARD

BACKGROUND OF THE INVENTION

1. Field of the Invention

The present invention relates to a flexible printed circuit board which has a metal foil layer formed only on one side of an insulating layer.

2. Description of the Related Art

Various electronic apparatuses employ a flexible printed circuit board (hereinafter also simply referred to as an "FPC") on which circuits are formed. The configuration of a commonly used double-sided FPC is shown in cross section in FIGS. 2A and 2B.

In FIG. 2A, an FPC 51 has a metal foil layer 54 formed on both sides of an insulating layer 52 via an adhesive layer 53. The FPC 51 includes through holes 55 which are partially formed to provide electrical conduction between the metal foil layers 54 provided on both the sides.

FIG. 2B shows the FPC 51 which is bent with electronic components mounted thereon. Drive ICs 56a and 56b are mounted on the metal foil layers 54 on both the sides, respectively, and the through holes 55 provide electrical conduction between these drive ICs 56a and 56b.

Inventive examples, which were developed to provide improved convenience to the FPC, are disclosed in Unexamined Japanese Patent Publications Nos. Hei 11-195850 and Hei 4-356996.

An FPC disclosed in Unexamined Japanese Patent Publication No. Hei 11-195850, or a single FPC which includes a double-sided FPC portion and a single-sided FPC portion, is configured such that the single-sided FPC portion is bent to overlap another single-sided FPC portion to make a bent portion of this overlapped portion. The bent portion being formed of a single-sided FPC portion reflects a creative idea to provide an improved bending property.

On the other hand, an FPC disclosed in Unexamined Japanese Patent Publication No. Hei 4-356996 or a double-sided FPC is configured such that a single-sided FPC having a base film coated with an adhesive is provided with holes by machining and affixed with a strip of conductor. The FPC is then subjected to etching for forming a conductor pattern. The FPC is thus provided with an electrically conductive pattern thereon and then cut at the holes, thereby forming terminal portions. This FPC is intended to provide terminal portions at high density and improve process time and costs.

However, so long as a double-sided FPC is employed, a conventional FPC, which is provided on both sides thereof with a metal foil layer, cannot be dispensed with a through hole for providing conduction between the metal foils on both the sides. The through hole thus formed will require to be plated for electrical continuity along the inner wall thereof, thereby causing an increase in the number of processing steps.

SUMMARY OF THE INVENTION

The present invention was developed to solve the aforementioned problems. It is therefore an object of the present invention to provide a flexible printed circuit board which can eliminate the need for forming through holes and ensure the strength required for mounting components.

To solve the aforementioned problems, a flexible printed circuit board of the present invention has a metal foil layer formed only on one side of an insulating layer. The flexible printed circuit board of the invention is configured such that the insulating layer is partially removed to flatten a surface of the metal foil layer. In an area where the insulating layer has been removed, an overcoat layer for reinforcing the metal foil layer is provided along the metal foil layer on a surface of the metal foil layer opposite to the flattened surface.

Electronic components to be mounted on the flexible printed circuit board are mounted on the metal foil layer provided only on one side of the insulating layer to be brought into conduction by the metal foil layer. It is thus possible to provide electrical conduction to the electronic components mounted on the metal foil layer without having to form through holes which would penetrate the insulating layer. Once a through hole is formed, plating is required to provide conduction through the inner wall thereof. However, according to the present invention, no through holes need to be formed, and thus the manufacturing process can be significantly simplified. Additionally, since an overcoat layer for reinforcing the metal foil layer is provided in an area where the insulating layer has been removed, it is possible to ensure sufficient strength to support the mounted electronic components.

In the present invention, the insulating layer and the overcoat layer may be formed of polyimide or a liquid crystal polymer.

The insulating layer and the overcoat layer formed of polyimide can provide a function of reinforcing the metal foil layer with stability in a wide variety of applications. On the other hand, the insulating layer and the overcoat layer formed of a liquid crystal polymer make it possible to form a pattern with high accuracy and stability for an application where a high-precision pattern needs to be formed. Furthermore, for an application where the FPC needs to be used under a severe environment with extreme temperatures or chemicals, it is possible to provide improved resistance to heat and chemicals. Additionally, in a case where the FPC is used under a high-frequency environment, it is also possible to provide the electrical property in an improved manner even in such a high-frequency environment. Additionally, the FPC has a low water absorbency and therefore even under a high humidity environment it is also possible to maintain the dimensional stability and the electrical property in an improved manner.

According to the present invention, it is possible to realize a flexible printed circuit board which can eliminate the need for forming through holes and ensure the strength required for mounting components.

DETAILED DESCRIPTION OF THE PREFERRED EMBODIMENTS

Now, the present invention will be described below in accordance with the embodiment.

Figure 1A:
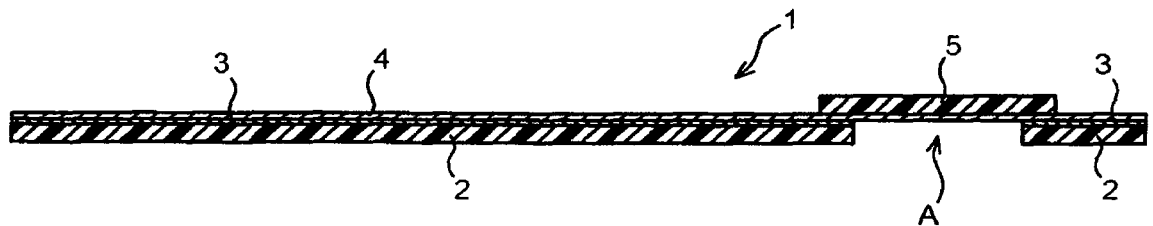
FIGS. 1A and 1B are cross-sectional views illustrating the configuration of a flexible printed circuit board according to an embodiment of the present invention.
Figure 1B:
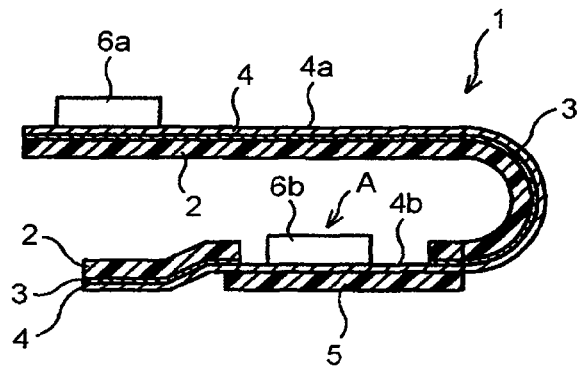
Figure 2A:
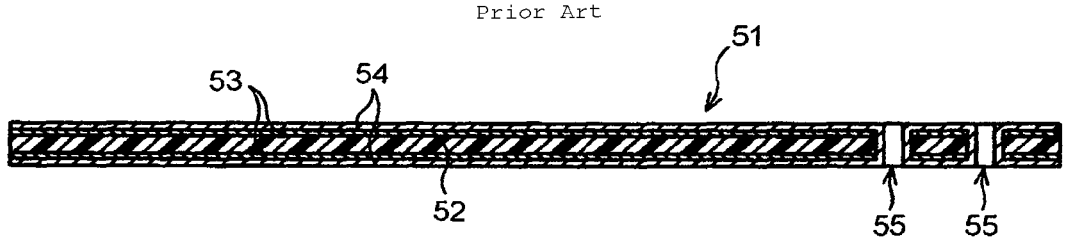
FIGS. 2A and 2B are cross-sectional views illustrating a commonly used double-sided flexible printed circuit board.
Figure 2B:
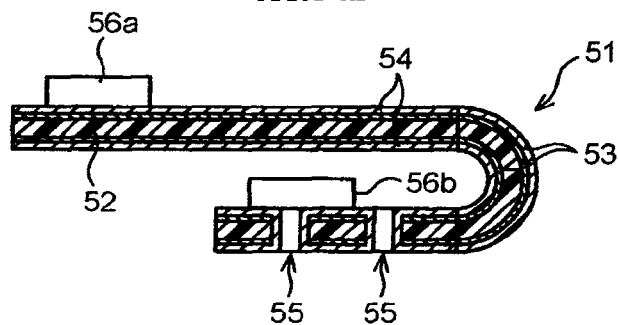

FIGS. 1A and 1B illustrate, in a cross section, the configuration of a flexible printed circuit board according to an embodiment of the present invention.

In an FPC 1 shown in FIG. 1A, a metal foil layer 4 is formed only on one side of an insulating layer 2 via an adhesive layer 3. The metal foil layer 4 is preferably formed of copper or a copper alloy which has a good electrical conductivity. The FPC 1 is configured such that the insulating layer 2 and the adhesive layer 3 are partially removed, and the surface of the metal foil layer 4 on the side from which the insulating layer 2 and the adhesive layer 3 have been removed is processed to become flat. In a region "A" from which the insulating layer 2 and the adhesive layer 3 have been removed, an overcoat layer 5 for reinforcing the metal foil layer 4 is provided along the metal foil layer 4 on the surface of the metal foil layer 4 opposite to the flattened surface. The region "A" from which the insulating layer 2 and the adhesive layer 3 are removed can also be provided at an end portion of the FPC 1. In addition, the region "A" can also be provided at any position on the FPC 1, not only at the end portion.

FIG. 1B shows the FPC 1 which is bent with electronic components mounted thereon. A drive IC 6a, as an example of electronic components, is mounted on a first metal foil face 4a of the metal foil layer 4, and the metal foil layer 4 provides electrical conduction to the drive IC 6a. In the region "A" from which the insulating layer 2 and the adhesive layer 3 have been removed, a drive IC 6b is mounted on a second metal foil face 4b which is the flattened surface of the metal foil layer 4, and the metal foil layer 4 also provides electrical conduction to the drive IC 6b.

In this region, the overcoat layer 5 for reinforcing the metal foil layer 4 is provided on the surface of the metal foil layer 4 opposite to the flattened surface, and thus the drive IC 6b mounted in this region is supported by the overcoat layer 5. The mounting carried out in this manner makes it possible to ensure sufficient strength to support the mounted electronic components without the need for forming any through hole.

Note that in the region where the drive ICs 6a and 6b are mounted, the metal foil layer 4 may be plated with a noble metal such as gold or with solder or nickel, while a cover coat may be applied to the other regions where no components are mounted. Even when such processing is performed, the number of processing steps can be reduced because the metal foil layer 4 is formed only on one side of the insulating layer 2.

Preferably, the metal foil layer 4 is within the range of 2 μm to 70 μm in thickness, and the adhesive layer 3 within the range of 1 μm to 30 μm in thickness. The insulating layer 2 can be formed of polyimide or a liquid crystal polymer. Preferably, the insulating layer 2 is, when polyimide is used, within the range of 7.5 μm to 225 μm in thickness and when a liquid crystal polymer is used, within the range of 12.5 μm to 225 μm in thickness. By way of example, the metal foil layer 4 can be formed in a thickness of 18 μm, the adhesive layer 3 in a thickness of 15 μm, and the insulating layer 2 of polyimide or a liquid crystal polymer in a thickness of 25 μm.

The overcoat layer 5, which is formed along the metal foil layer 4 via an adhesive, can be formed of polyimide or a liquid crystal polymer. With the adhesive formed within the range of 2 μm to 70 μm in thickness, the overcoat layer 5 is preferably 7.5 μm to 225 μm in thickness when polyimide is used, and 12.5 μm to 225 μm in thickness when a liquid crystal polymer is used. By way of example, the adhesive can be formed in a thickness of 25 μm, while the overcoat layer 5 of polyimide or a liquid crystal polymer can be formed in a thickness of 25 μm.

A method of forming the FPC 1 configured as shown in FIGS. 1A and 1B varies depending on whether it is formed of a single layer material of metal foil or resin, or a laminated composite material of metal foil and resin.

To make the FPC 1 using a composite material, the metal foil layer 4 is subjected to copper etching to form a circuit, and the resin of polyimide or a liquid crystal polymer laminated is processed to expose the metal foil at a predetermined area. Alternatively, this process may be reversed such that the metal foil at the predetermined area is exposed, and thereafter the metal foil layer 4 is subjected to copper etching to form a circuit. Then, as required, the metal foil layer 4 is subjected to plating to protect the surface thereof, and then the overcoat layer 5 is formed at the area where the metal foil is exposed.

To make the FPC 1 using a single layer material, the resin material such as polyimide or a liquid crystal polymer is patterned to make an opening at the predetermined area. Then, a strip of metal foil is affixed to and exposed at the predetermined area, and thereafter the metal foil layer 4 is subjected to copper etching to form a circuit. Then, as required, the metal foil layer 4 is subjected to plating to protect the surface thereof, and then the overcoat layer 5 is formed at the area where the metal foil is exposed.

Note that the description above is based on the precondition that the insulating layer 2 and the metal foil layer 4 are adhered to each other via the adhesive layer 3. However, the insulating layer 2 and the metal foil layer 4 can also be directly affixed to each other by thermo-compression bonding or the like without the intervention of the adhesive layer 3. Alternatively, the FPC can be configured using, as a composite material, a laminated copper material having no adhesive layer 3. Likewise, to form the overcoat layer 5, polyimide or a liquid crystal polymer can be directly affixed to the metal foil layer 4 without using an adhesive.

Several methods are available to remove the insulating layer 2 and the adhesive layer 3 to expose the metal foil layer 4 or, in the absence of the adhesive layer 3, to remove the insulating layer 2 to expose the metal foil layer 4.

Firstly, in the absence of the adhesive layer 3, wet etching can be employed when the insulating layer 2 is formed of a thermoplastic polyimide. This method allows for fine patterning by photolithography with high positional accuracy, thereby realizing reduced process time and providing devices at low costs.

Secondly, plasma etching can be used. This method allows for fine patterning by photolithography with high positional accuracy, but may cause increases in process time and in costs due to the configuration of the device. It is thus difficult to cut the costs.

Thirdly, laser etching can be used. This method allows for fine patterning but may cause positional accuracy to degrade and carbide to be formed, thereby requiring desmearing.

Fourthly, to form the FPC of a single layer material, machining using such as a mold or a router can be employed. However, this method may cause degradation in positional accuracy and is thus not suitable for fine patterning, and can be thus used only for a roughly patterned FPC.

On the other hand, to form the overcoat layer 5, several methods are available. For example, as in thermo-compression pressing, heat and pressure can be applied for bonding an insulating resin film of polyimide or a liquid crystal polymer. Alternatively, an adhesive can be employed for bonding an insulating resin film of polyimide or a liquid crystal polymer, or an insulating resin varnish of polyimide or a liquid crystal polymer may be applied.

According to the FPC of the present invention, an electronic component is mounted in a region where the insulating layer 2 and the adhesive layer 3 are removed to expose the metal foil layer 4 by one of the aforementioned methods. Since the accuracy of processing required varies depending on the application, one of the processing methods can be selected depending on the desired processing accuracy.

As described above, the FPC of the present invention is configured such that the metal foil layer 4 for providing conduction to an electronic component is formed only on one side of the insulating layer 2, thereby allowing for saving labor in processing or resources such as copper. Furthermore, since sufficient strength for mounting components can be ensured, the FPC is particularly useful for mounting components in a small-sized electronic apparatus intended for mobile use such as a mobile phone.

The flexible printed circuit board according to the present invention can be employed as a flexible printed circuit board which can eliminate the need for forming through holes and ensure the strength required for mounting components. The flexible printed circuit board can also be used for mounting a liquid crystal display device of a mobile phone or the like as a flexible printed circuit board which allows for saving labor in processing and resources.

What is claimed is:

1. A flexible printed circuit board comprising:
   a metal foil layer, the metal foil layer having a first side and an opposing second side;
   a first electronic device, the first electronic device being disposed on the second side of the metal foil layer;
   an adhesive layer, the adhesive layer being disposed on the first side of the metal foil layer;
   an insulating layer, the insulating layer being disposed on the adhesive layer; and
   an open region, the open region being created by the removal of a portion of the adhesive layer and the insulating layer are simultaneously removed, the open region exposing the first side of the metal foil layer; and
   a second electronic device, the second electronic device being disposed on the exposed first side of the metal foil layer within the open region;
   wherein an overcoat layer is disposed on the second side of the metal foil layer opposite the open segment.

2. The flexible printed circuit board of claim 1, wherein the first electronic device and the second electronic device are in electronic communication with each other via the metal foil layer.

3. The flexible printed circuit board of claim 2, wherein the insulating layer and the overcoat layer are formed of a polyimide.

4. The flexible printed circuit board of claim 2, wherein the insulating layer and the overcoat layer are formed of a liquid crystal polymer.

* * * * *